(12) United States Patent
Ahn

(10) Patent No.: US 7,638,942 B2
(45) Date of Patent: Dec. 29, 2009

(54) ENCAPSULATION CAP HAVING A GETTER AND DISPLAY DEVICE USING THE SAME

(75) Inventor: Jung Keun Ahn, Kyongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 391 days.

(21) Appl. No.: 11/245,025

(22) Filed: Oct. 7, 2005

(65) Prior Publication Data

US 2006/0076886 A1 Apr. 13, 2006

(30) Foreign Application Priority Data

Oct. 11, 2004 (KR) ............... 10-2004-0081044
Oct. 11, 2004 (KR) ............... 10-2004-0081045

(51) Int. Cl.
*H01J 63/04* (2006.01)

(52) U.S. Cl. ............................................. 313/512

(58) Field of Classification Search .................. 313/512
See application file for complete search history.

(56) References Cited

U.S. PATENT DOCUMENTS

| | | | |
|---|---|---|---|
| 5,359,261 A * | 10/1994 | Kondo et al. ............... | 313/509 |
| 7,316,756 B2 * | 1/2008 | Boroson ..................... | 313/512 |
| 2004/0212300 A1* | 10/2004 | Chao et al. ................. | 313/506 |
| 2005/0179378 A1* | 8/2005 | Oooka et al. ............... | 313/512 |
| 2005/0194889 A1* | 9/2005 | Chen et al. ................. | 313/495 |
| 2006/0017379 A1* | 1/2006 | Su et al. ..................... | 313/506 |
| 2007/0131944 A1* | 6/2007 | Hu et al. .................... | 257/81 |
| 2007/0268201 A1* | 11/2007 | Sampsell et al. ........... | 345/1.1 |
| 2008/0054800 A1* | 3/2008 | Oooka et al. ............... | 313/504 |

FOREIGN PATENT DOCUMENTS

| | | | |
|---|---|---|---|
| EP | 0 182 609 B1 | | 5/1990 |
| JP | 61-158951 A | | 7/1986 |
| JP | 2002304961 A | * | 10/2002 |
| JP | 2004-186043 A | | 7/2004 |

* cited by examiner

*Primary Examiner*—Peter Macchiarolo
(74) *Attorney, Agent, or Firm*—Birch, Stewart, Kolasch & Birch, LLP

(57) ABSTRACT

The present invention discloses an encapsulation cap which not only seals simultaneously structural elements formed on two substrates but also has sufficient moisture-absorbing function by using only one getter (moisture absorbent) attached thereto, and a display device using the same. For separating structural elements formed on the glass substrate from the exterior, an encapsulation cap according to the present invention comprises a first surface on which a first recess is formed; and a second surface which is opposite to the first surface and has a second recess formed thereon, wherein the first surface is attached to a first substrate on which structural elements are formed, the second surface is attached to a second substrate on which structural elements are formed, and the structural elements formed on the first and second substrates are received in the first and second recess, respectively.

2 Claims, 2 Drawing Sheets

ENCAPSULATION CAP HAVING A GETTER AND DISPLAY DEVICE USING THE SAME

BACKGROUND OF THE INVENTION

1. Field of the Invention

The present invention relates to an encapsulation cap, particularly substrates capable of being attached to its two surfaces and absorbing moisture for structural elements formed on the substrates, and a display device using the same.

2. Description of the Related Art

Organic electroluminescence is the phenomenon that excitons are formed in an (low molecular or high molecular) organic material thin film by re-combining holes injected through an anode with electrons injected through a cathode, and light of specific wavelength is generated by energy from thus formed excitons.

Organic electroluminescent device using the above phenomenon has a basic structure as shown in FIG. 1. Basically, the structure of organic electroluminescent device includes a glass substrate 1, indium-tin-oxide layers 2 (hereinafter, referred as "ITO layer") formed on the glass substrate 1 and acting as anode electrode, insulating layer, organic electroluminescence layer 3 formed with organic material, and metal layer 4 acting as cathode electrode. Reference mark "W" which is not mentioned above indicates a wall formed to divide the organic electroluminescence layer 3 and the metal layer 4 into a number of sections.

On the other hand, structural elements constituting the organic electroluminescence are well known in the organic electroluminescent device field. Therefore, a detailed description thereon is omitted.

The organic electroluminescence layer 3 which is one of the elements constituting the organic electroluminescent device having the above structure is characterized to be vulnerable to moisture and heat. Accordingly, in order to separate the organic electroluminescence layer 3 from the exterior (atmosphere), a metal cap 10 is fixed to the outer portion of the substrate 1, and so the inner space, that is, each structural element of the device, is sealed. The structure of the metal cap 10 having the above function and bonding process is briefly described below.

In general, the metal cap 10 is divided into a bonding section 11 to be bonded on the outer portion of the substrate 1, a first space section 12 formed at the inner side of the bonding section 11 for receiving the metal layers 4, the organic electroluminescence layer 3 and the walls, and a second space section 13 formed at the inner side of the first space section 12. A getter 6 absorbing moisture is attached to the bottom surface of the second space section 13 by tape 5.

After the above structural elements are formed on the glass substrate 1, a sealant is dispensed on the bottom surface of the bonding section 11 of the metal cap, and the metal cap 10 is then pressurized to the substrate 1 to bond the metal cap 10 on the substrate 1. Accordingly, the structural elements formed on the substrate 1 are completely separated from the exterior by the metal cap 10.

As shown in FIG. 2, on the other hand, in the cellular phone H which has been widely used as communication device, a sub window SW formed on the front surface of the display section D and a main window MW formed on the rear surface of the display section are provided separately. In the current cellular phone, the liquid crystal display (LCD) device is used as the main window MW, and the organic electroluminescence device (OLED) is used as the sub window SW. The main window MW and the sub window SW are designed to be operated and controlled independently by its own electric circuit (memory chip).

Now, the cellular phone has become smaller, and the definition of displayed image has been greatly improved. Thus, technical development has aimed to operate and control the sub window and the main window by constituting them with the organic electroluminescence devices and using one electric circuit (chip).

When the sub window and the main window are constituted with the organic electroluminescence device, special attention should be paid to the structure of the cap, which is one of the elements constituting the organic electroluminescence device as described above, and is used for separating the organic electroluminescence layer from the exterior (atmosphere).

In the case that the sub window and the main window are constituted with the organic electroluminescence device, each organic electroluminescence device used as the sub window and the main window should comprises the cap for protecting the structural elements including the organic electroluminescence layer. However, the cap (shown in FIG. 1) bonded to the substrate increases the size (thickness) of the organic electroluminescence device. In particular, since each organic electroluminescence device includes two caps, the size (thickness) of the finished product, i.e. the cellular phone, cannot but be increased.

SUMMARY OF THE INVENTION

An object of the present invention is to provide an encapsulation cap which can seal simultaneously structural elements formed on two substrates constituting sub window and main window formed on both surfaces of a display section, and a display device using the same.

Another object of the present invention is to provide an encapsulation cap which not only seals simultaneously structural elements formed on two substrates but also has sufficient moisture-absorbing function by using only one getter (moisture absorbent) attached thereto, and a display device using the same.

For separating structural elements formed on the glass substrate from the exterior, an encapsulation cap according to the present invention comprises a first surface on which a first recess is formed; and a second surface which is opposite to the first surface and has a second recess formed thereon, wherein the first surface is attached to a first substrate on which structural elements are formed, the second surface is attached to a second substrate on which structural elements are formed, and the structural elements formed on the first and second substrates are received in the first and second recess, respectively.

The encapsulation cap has a penetrating hole formed on the bottom surface of one recess to connect the first recess to the second recess, and a getter is attached onto the bottom surface of one recess, and the getter is attached onto the periphery of the penetrating hole.

Also, the cap has a plurality of penetrating holes formed on the bottom surface of one recess to connect the first recess to the second recess, and a getter is attached onto the bottom surface of one of the recesses. Here, a plurality of penetrating holes are formed on the region on which the getter is attached, or a plurality of penetrating holes can be formed on the outer side of the region on which the getter is attached.

A display device according to the present invention comprises a cap having a first surface on which a first recess is formed and a second surface which is opposite to the first surface and has a second recess formed thereon; a first substrate on which structural elements are formed, the first substrate being attached to the first surface of the cap; a second substrate on which structural elements are formed, the second substrate being attached to the second surface of the cap; and at least one getter attached to at least one bottom surface of the recess to absorb moisture existing in the both recesses.

Here, the cap has a penetrating hole formed on a bottom surface of one recess to connect the first recess to the second recess and the getter is attached onto the periphery of the penetrating hole.

Also, the cap has a plurality of penetrating holes formed on the bottom surface of one recess to connect the first recess to the second recess, and a getter is attached onto the bottom surface of one of the recesses. In this case, a plurality of penetrating holes are formed on the region onto which the getter is attached or on the out side of the region onto which the getter is attached.

In particular, the getter can be attached onto the bottom surface of each recess.

BRIEF DESCRIPTION OF THE DRAWINGS

The present invention will be more clearly understood from the detailed description in conjunction with the following drawings.

DETAILED DESCRIPTON OF THE INVENTION

Hereinafter, the embodiments of the present invention will be described in detail with reference to those accompanying drawings.

Figure 1:
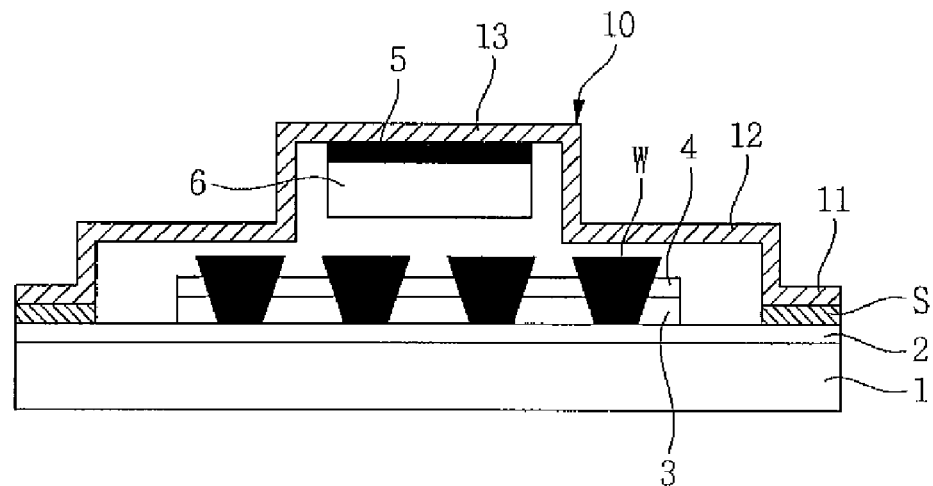
FIG. 1 is a sectional view of conventional electroluminescent device.
Figure 2:
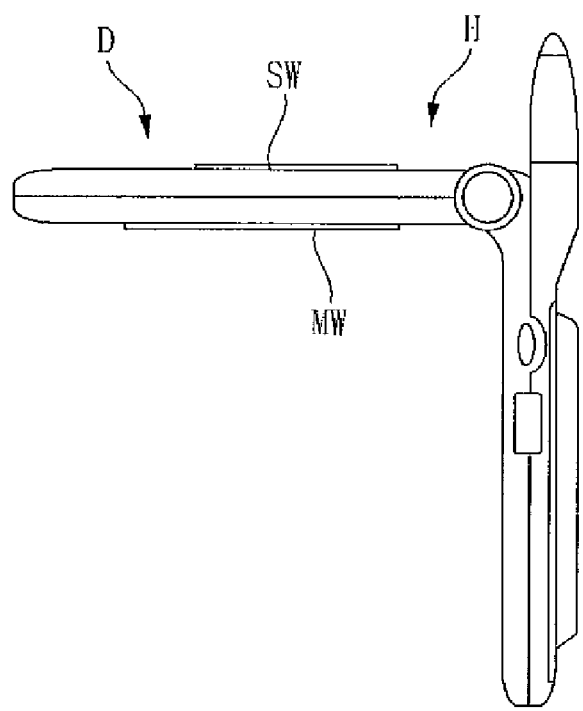
FIG. 2 is a schematic side view of cellular phone.
Figure 3:
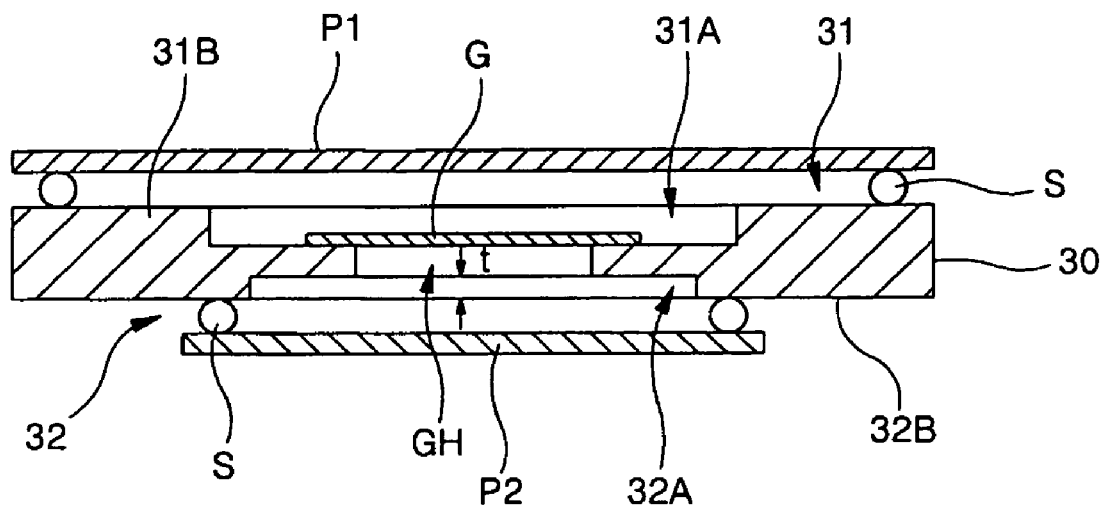
FIG. 3 is a sectional view showing the relation between two substrates on which the structural elements are formed and the cap according to a first embodiment of the present invention.

FIG. 3 is a sectional view showing the relation between two substrates on which the structural elements are formed and a cap according to the first embodiment of the present invention. Although the structural elements as shown in FIG. 1 are formed on each of substrates P1 and P2 shown in FIG. 3, these elements are not shown in FIG. 3 for convenience's sake.

The most important feature of the encapsulation cap according to this embodiment is that the first substrate P1 and the second substrate P2 are bonded to seal off to a first surface 31 and a second surface 32 opposite to the first surface, respectively, of a flat plate-shaped cap 30.

Recesses 31A and 32A with certain depth and width are formed on the first surface 31 and the second surface 32 of the flat plate-shaped cap 30. A penetrating hole GH of certain size is formed on a certain region of a member dividing the first and second recesses 31A and 32A. Accordingly, the first recess 31A is connected to the second recess 32A through the penetrating hole GH.

On the other hand, a getter G, moisture absorbent, is attached to the bottom surface of any one of the first recess 31A and the second recess 32A (in FIG. 3, the first recess 31A). That is, the periphery of lower surface of the getter G is attached onto the bottom surface of the first recess 31A around the penetrating hole GH. Thus, the first surface of the getter G is exposed to space of the first recess 31A, and the second surface of the getter G opposite surface to the first surface, is exposed to space of the second recess 32A through the penetrating hole GH.

A sealant S is dispensed on outer portions 31B and 32B of the first surface 31 and the second surface 32 of the cap 30, that is, the outer portions of the recesses 31A and 32A. And, the first and second substrates P1 and P2 are bonded to the outer portions 31B and 32B of the first and second surfaces 31 and 32, respectively, through the sealant S.

The structural elements (not shown) formed on the surfaces of the first substrate P1 and the second substrate P2 correspond to the recesses 31A and 32A formed on the first surface 31 and the second surface 32 of the cap 30, respectively so that all structural elements formed on the two substrates P1 and P2 do not contact with the cap 30. Also, since the structural elements formed on the surfaces of the first and second substrates P1 and P2 correspond to the recesses 31A and 32A formed on the first and second surfaces 31 and 32 of the cap 30, respectively, light penetrating through two substrates P1 and P2 can be observed from the outside.

Moisture existing in the first recess 31A including the structural elements formed on the first substrate P1 is absorbed by the getter G attached to the bottom surface of the first recess 31A. And, moisture existing in the second recess 32A including the structural elements of the second substrate P2 is absorbed by the getter G attached to the bottom surface of the first recess 31A through the penetrating hole GH.

On the other hand, FIG. 3 shows that the getter G attached to the bottom surface of one recess (for example, 31A) of the cap 30 has a flat plate shape. However, in this case, the central portion of the getter G corresponds to the penetrating hole GH, and so there is no supporting member. Accordingly, the getter G may be deformed due to certain reason such as deflection of the central portion, and such deformation of the getter G may cause a contact between the getter G and the structural elements formed on the substrate.

In this embodiment, an opening (not shown in FIG. 3), whose size is larger than or same as the penetrating hole GH formed on the bottom surface of the recess, that is, in the cap, is formed on the central portion of the getter G to prevent the getter G from being deflected.

Figure 4:
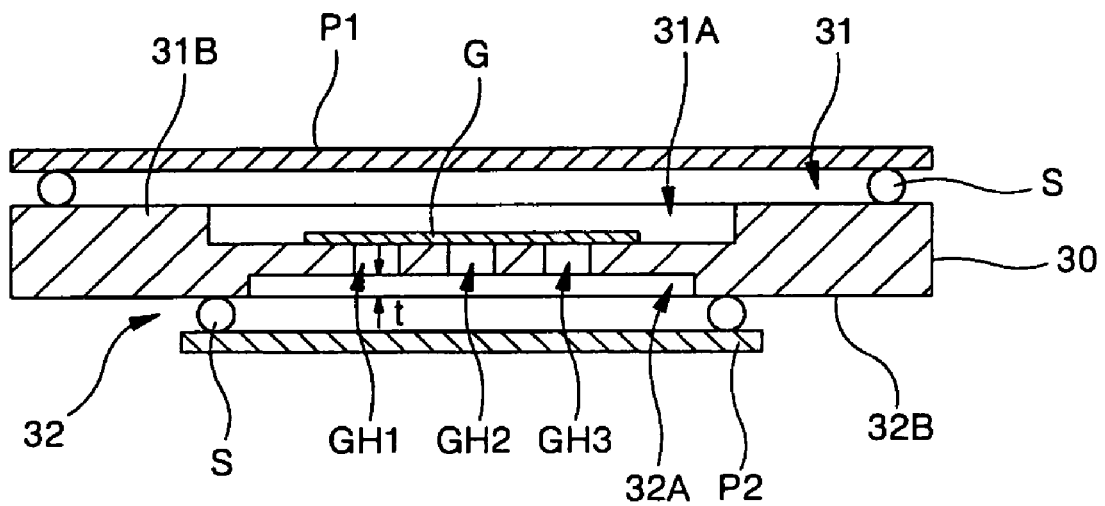
FIG. 4 is a sectional view showing the relation between two substrates on which the structural elements are formed and the cap according to a second embodiment of the present invention.

FIG. 4 is a sectional view showing the relation between the two substrates on which the structural elements are formed and a cap according to the second embodiment of the present invention. The structural elements as shown in FIG. 1 are formed on each of the substrates P1 and P2 shown in FIG. 4, but these elements are not shown in FIG. 4 for convenience's sake. Also, the same elements as those of the first embodiment are denoted by the same reference numerals.

In the encapsulation cap 30 according to this embodiment, the first substrate P1 and the second substrate P2 are bonded to seal off to the first surface 31 and the second surface 32 opposite to the first surface, respectively.

Recesses 31A and 32A with certain depth and width are formed on the first surface 31 and the second surface 32, respectively, of the flat plate-shaped cap 30. A plurality of penetrating holes GH1, GH2 and GH3 are formed on certain region of a member dividing the first and second recesses 31A and 32A. Accordingly, the first recess 31A is connected to the second recess 32A through these penetrating holes GH1, GH2 and GH3 . . . .

On the other hand, the getter G, which is moisture absorbent, is attached to the bottom surface of any one of the first recess 31A and the second recess 32A (in FIG. 4, the first recess 31A). Thus, the first surface of the getter G is exposed to space of the first recess 31A, and the second surface of the getter G opposite surface to the first surface is exposed to space of the second recess 32A through the penetrating holes GH1, GH2 and GH3 . . . .

A sealant S is dispensed on outer portions 31B and 32B of the first surface 31 and the second surface 32 of the cap 30, that is, the outer portions of the recesses 31A and 32A. And, the first and second substrates P1 and P2 are bonded to the outer portions of the recesses 31A and 32A, respectively, through the sealant S.

The structural elements (not shown) formed on one surface of the first substrate P1 correspond to the recess 31A formed on the first surface 31 of the cap 30, and the structural elements (not shown) formed on one surface of the second substrate P2 correspond to the second recess 32A formed on the second surface 32 of the cap 30. Thus, all structural elements formed on the two substrates P1 and P2 do not contact with the cap 30. Also, the structural elements formed on the surfaces of the first and second substrates P1 and P2 correspond to the recesses 31A and 32A formed on the first and second surfaces 31 and 32 of the cap 30, respectively, and so light penetrating the two substrates P1 and P2 may be observed from the exterior.

Here, the getter G attached to the bottom surface of the first recess 31A absorbs moisture existing in the first recess 31A including the structural elements formed on the first substrate P1. Also, moisture existing in the second recess 32A including the structural elements formed on the first substrate P2 is absorbed by the getter G attached to the bottom surface of the first recess 31A through these penetrating holes GH1, GH2 and GH3 . . . .

On the other hand, FIG. 4 shows that these penetrating holes GH1, GH2 and GH3 . . . are formed on the region to which the getter G is attached. However, if the cap is structured to connect the first recess 31A and the second recess 32A to each other, the region that these penetrating holes GH1, GH2 and GH3 . . . are formed is not limited thereon.

That is, in order to increase the bonding force between the bottom surface of the recess and the getter G, the penetrating holes GH1, GH2 and GH3 . . . may not be formed on the region to which the getter G is attached, but can be formed at the outer region of the region to which the getter G is attached.

In the above structure, the first and second recesses 31A and 32A are connected to each other by these penetrating holes GH1, GH2 and GH3 . . . , and so moisture existing in the recess in which the getter is not attached can be flowed into the other recess to which the getter is attached through the penetrating holes GH1, GH2 and GH3 . . . , enough to perform the moisture-absorbing function for both devices.

On the other hand, FIG. 3 and FIG. 4 show that the recesses 31A and 32A are formed on the first and second surfaces 31 and 32 of the cap 30, respectively, and the penetrating hole of certain size GH (FIG. 3) or a plurality of penetrating holes GH1, GH2 and GH3 . . . (FIG. 4) are formed on certain region of a member dividing the first and second recesses 31A and 32A. However, the getter may be attached to the bottom surface of each of recesses 31A and 32A without the penetrating hole GH or a plurality of penetrating holes GH1, GH2 and GH3 . . . .

In the encapsulation cap of the present invention as described above, two substrates on which the structural elements are formed each may be attached to the recesses formed on two surfaces of the cap constituted with single member to separate the structural elements formed on two substrates completely from the exterior with only one cap.

Also, the getter may be attached to the bottom surface of only one recess to perform moisture-absorbing function for two devices. Thus, the present invention is advantageous in simplifying the attaching process of the getter and saving the getter material.

In addition, as shown in FIG. 4, the getter is attached to the bottom surface of only one of the recesses of the cap, and so the depth (t in FIG. 3 and FIG. 4) of other recess to which the getter is not attached can be minimized enough to meet the height of the structural elements formed on the substrate. Thus, the height of the finished device can be reduced.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An encapsulation cap attached onto outer portions of first and second substrates constituting a display device for separating the first and second substrates, the encapsulation cap comprising:
    a first surface in which a first recess is formed;
    a second surface which is opposite to the first surface and has a second recess formed therein;
    at least one penetration hole formed to connect the first recess to the second recess,
    wherein the first surface is attached to the first substrate by a first sealant, the second surface is attached to the second substrate by a second sealant.

2. A display device, comprising:
    a cap having a first surface on which a first recess is formed, a second surface which is opposite to the first surface and has a second recess formed therein, at least one penetration hole formed to connect the first recess to the second recess; and at least one getter attached on at least one of the first and second recesses to cover the at least one penetration hole;
    a first substrate to which the first surface of the cap is attached by a first sealant; and
    a second substrate to which the second surface of the cap is attached by a second sealant.

* * * * *